(12) United States Patent
Kim

(10) Patent No.: US 7,250,342 B2
(45) Date of Patent: Jul. 31, 2007

(54) METHOD OF FABRICATING A MOSFET HAVING A RECESSED CHANNEL

(75) Inventor: Ji-young Kim, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/699,047

(22) Filed: Oct. 30, 2003

(65) Prior Publication Data

US 2004/0135176 A1    Jul. 15, 2004

(30) Foreign Application Priority Data

Jan. 11, 2003    (KR) ...................... 10-2003-0001813

(51) Int. Cl.
*H01L 21/336* (2006.01)
(52) U.S. Cl. ...................... 438/270; 438/259
(58) Field of Classification Search ................ 438/197, 438/259, 268, 270
See application file for complete search history.

(56) References Cited

U.S. PATENT DOCUMENTS

| | | | | |
|---|---|---|---|---|
| 5,362,665 A | * | 11/1994 | Lu | 438/253 |
| 5,512,517 A | * | 4/1996 | Bryant | 438/302 |
| 6,251,730 B1 | * | 6/2001 | Luo | 438/270 |
| 6,482,701 B1 | * | 11/2002 | Ishikawa et al. | 438/270 |
| 6,509,233 B2 | * | 1/2003 | Chang et al. | 438/270 |
| 6,518,616 B2 | * | 2/2003 | Dyer et al. | 257/301 |
| 6,617,213 B2 | * | 9/2003 | Hummler | 438/270 |
| 6,740,558 B1 | * | 5/2004 | Hummler | 438/268 |
| 6,780,732 B2 | * | 8/2004 | Durcan et al. | 438/430 |
| 2002/0196651 A1 | * | 12/2002 | Weis | 365/100 |
| 2006/0035434 A1 | * | 2/2006 | Tabata et al. | 438/270 |

FOREIGN PATENT DOCUMENTS

| KR | 2000-0060693 | 10/2000 |
|---|---|---|
| KR | 2001-0064328 | 7/2001 |

OTHER PUBLICATIONS

English language abstract of Korea Publication No. 2000-0060693.
English language abstract of Korea Publication No. 2001-0064328.

* cited by examiner

*Primary Examiner*—Zandra V. Smith
*Assistant Examiner*—Khanh Duong
(74) *Attorney, Agent, or Firm*—Marger, Johnson & McCollom, P.C.

(57) ABSTRACT

A MOSFET having a recessed channel and a method of fabricating the same. The critical dimension (CD) of a recessed trench defining the recessed channel in a semiconductor substrate is greater than the CD of the gate electrode disposed on the semiconductor substrate. As a result, the misalignment margin for a photolithographic process used to form the gate electrodes can be increased, and both overlap capacitance and gate induced drain leakage (GIDL) can be reduced.

18 Claims, 7 Drawing Sheets

METHOD OF FABRICATING A MOSFET HAVING A RECESSED CHANNEL

CROSS REFERENCES TO RELATED APPLICATIONS

This application claims priority under 35 U.S.C. §119 from Korean Patent Application No. 2003-01813, filed on Jan. 11, 2003, the contents of which are hereby incorporated by reference in their entirety.

BACKGROUND OF THE INVENTION

1. Field of the Invention

The present invention relates to a metal oxide semiconductor field effect transistor (MOSFET) and a method of fabricating the same. More specifically, the present invention relates to a MOSFET having a recessed channel, which is suitable for highly integrated semiconductor circuits, and a method of fabricating the same.

2. Description of the Related Art

As MOSFETs become highly integrated, their channel length decreases and they become more adversely affected by short channel effect and source/drain punch-through. To overcome the reduction in the channel length due to the device shrinkage, a MOSFET having a recessed channel is proposed. This recessed trench is formed in a region that is to be used as the channel of a transistor and it aids in effectively increasing the channel length. Thus, the area of a device can be further scaled down.

As shown in FIG. 1, a conventional MOSFET having a recessed channel comprises a recessed trench 30 formed in a silicon substrate 10, which is bonded to a gate electrode 60 formed on the silicon substrate 10. Here, the critical dimension (CD) L1 of the recessed trench 30 is adjusted to be less than the CD L2 of the gate electrode 60 such that the gate electrode 60 outwardly overlaps the entire recessed trench 30. Thus, during the patterning required to shape the gate electrodes there is a small misalignment margin of error when attempting to form the gate electrodes over the trenches.

However, in this structure, due to a patterning limit, it is difficult to form the recessed trench 30 having a small CD by using photolithography. Thus, a complicated process is required comprising patterning a silicon nitride mask for defining an opening on a substrate, forming spacers on sidewalls of the silicon nitride mask to reduce the CD of the opening, and etching the substrate disposed under the opening. Also, an electric field, which is focused on upper edges 70 of the recessed trench 30, allows a leakage current to increase. In FIG. 1, reference numeral 15 denotes a device isolation layer, 35 denotes a gate oxide layer, 50 denotes a gate conductive layer, 55 denotes a capping layer, and 65 denotes a spacer.

SUMMARY OF THE INVENTION

The present invention provides a MOSFET having a recessed channel that provides a misalignment margin necessary to enable high integration. The present invention also provides a method of fabricating a MOSFET having a recessed channel using a simplified process.

In accordance with an aspect of the present invention, a MOSFET having a recessed channel, in which the CD of a recessed trench defining the recessed channel in a semiconductor substrate is greater than the CD of a gate electrode formed on the semiconductor substrate such that the gate electrode inwardly overlaps the recessed trench, is provided.

It is preferred in the present invention that a MOSFET having a recessed channel comprises: a gate electrode, which includes a gate oxide layer that is formed on an inner wall of the recessed trench formed in the semiconductor substrate where a device isolation layer is formed; a gate conductive layer, which fills the recessed trench and rises over the semiconductor substrate, wherein a portion of the gate conductive layer rising over the semiconductor substrate is formed to be smaller than the CD of the recessed trench; and a capping layer which is formed on the gate conductive layer to have the same CD as that of the gate conductive layer. This MOSFET can further comprise spacers surrounding the sidewalls of the gate electrode, and a source/drain region formed in the semiconductor substrate on both sides of the gate electrode so as to be insulated from the gate conductive layer by the gate oxide layer.

Additionally, it is preferable that the recessed trench has round profile. The gate oxide layer may be composed of a silicon oxide layer, a titanium oxide layer, or a tantalum oxide layer. The gate conductive layer may comprise a conductive polysilicon layer that completely fills the recessed trench and a metal layer formed thereon. The spacers may be extended into the semiconductor substrate to a depth of 500 Å or less.

In accordance with another aspect of the present invention, a method of forming a MOSFET having a recessed channel is provided, which comprises forming a recessed trench, forming a gate oxide layer on an inner wall of the recessed trench, and sequentially forming a gate conductive layer and a capping layer on the gate oxide layer so as to completely fill the recessed trench. Then, the capping layer and the gate conductive layer, which both rise over the semiconductor substrate, are patterned to have a smaller CD than that of the recessed trench. This results in a gate electrode that inwardly overlaps the gate conductive layer filling the recessed trench. Next, impurity ions are implanted into the semiconductor substrate on both sides of the gate electrode so as to form a source/drain region.

It is preferred in the present invention that forming the recessed trench comprises forming a rectangular trench in the semiconductor substrate using a reactive ion beam etch (RIE) process, and making the profile of the recessed trench round by further etching the trench using a chemical dry etch (CDE) process. The rectangular trench is formed to a depth of about 1000 Å to 1500 Å and is further etched by about 100 Å to 200 Å using the CDE process. The method of forming the MOSFET having a recessed channel further comprises forming a sacrificial oxide layer by thermally oxidizing the semiconductor substrate and removing the sacrificial oxide layer using a wet etch process between forming the recessed trench and forming the gate oxide layer.

BRIEF DESCRIPTION OF THE DRAWINGS

The above and other features of the present invention will become more apparent by describing in detail preferred embodiments thereof with reference to the attached drawings in which.

DETAILED DESCRIPTION OF THE INVENTION

Figure 1:
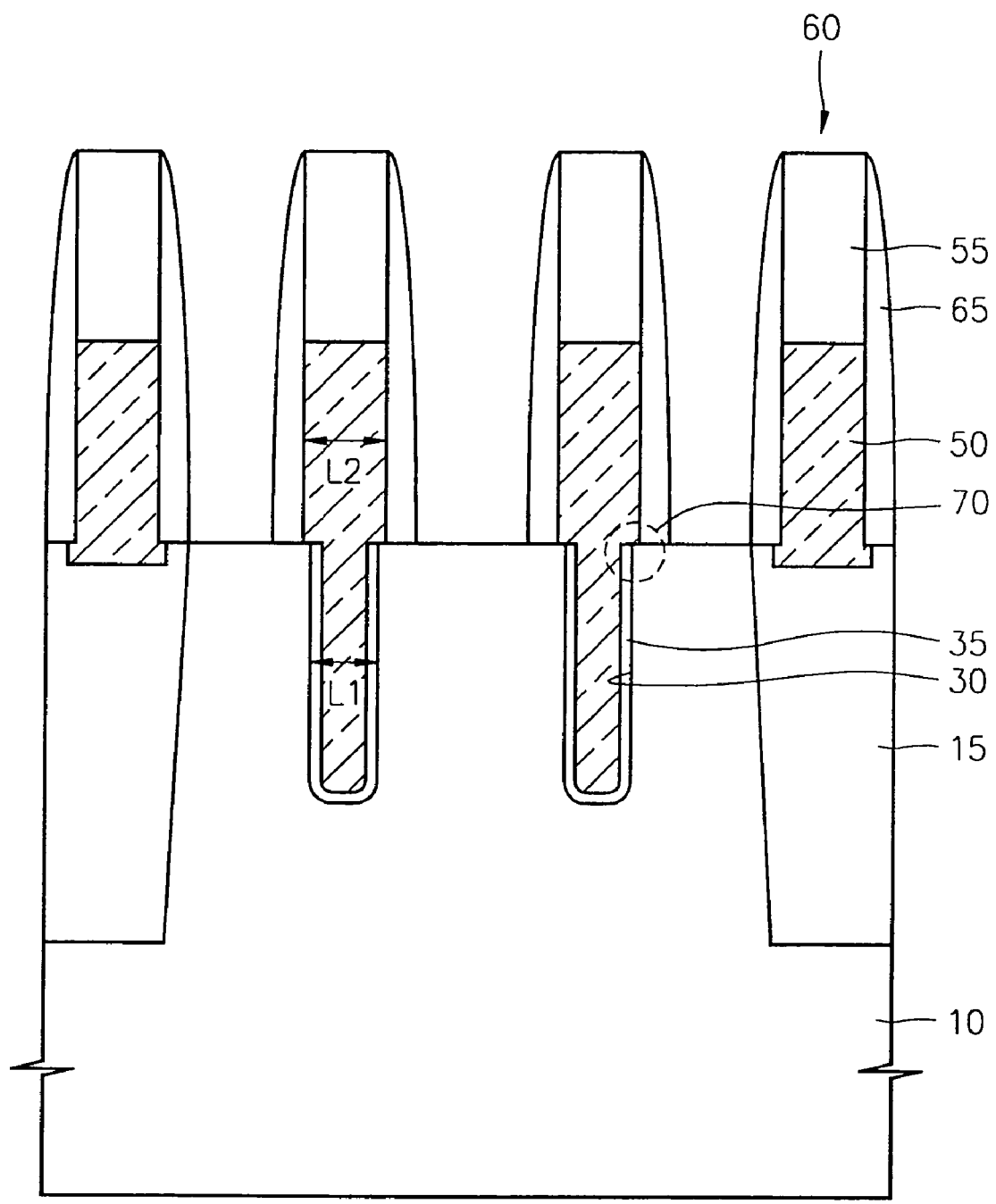
FIG. 1 is a cross-sectional view of a conventional MOSFET having a recessed channel.

The present invention will be described more fully hereinafter with reference to the accompanying drawings in which an embodiment of the invention is shown. This invention may, however, be embodied in many different forms and should not be construed as being limited to the embodiment set forth herein. Rather, the embodiment is provided so that this disclosure is thorough and complete and fully conveys the scope of the invention to those skilled in the art, In the drawings, the shapes and forms of elements are exaggerated for clarity.

FIGS. 2 through 8 are cross-sectional views illustrating a method of fabricating a MOSFET having a recessed channel according to an embodiment of the present invention.

Figure 2:
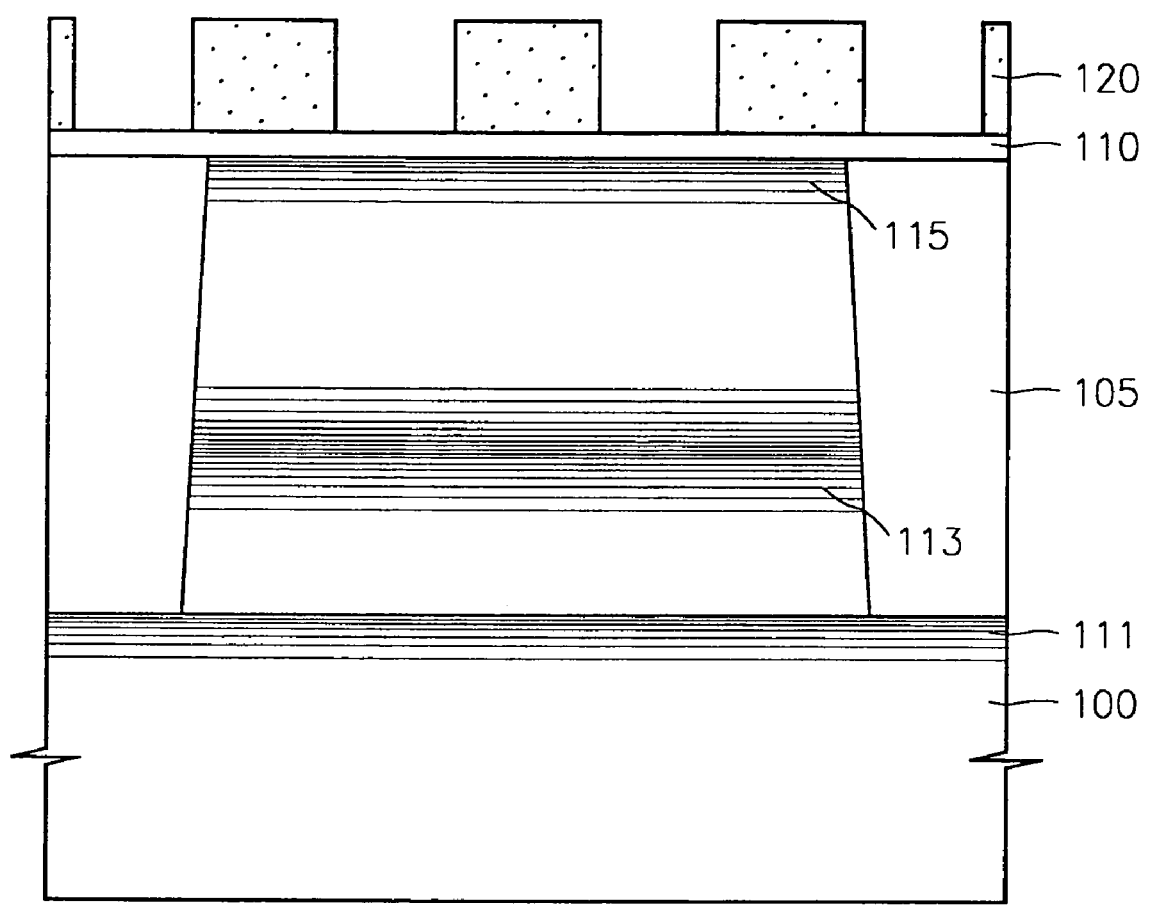
FIGS. 2 through 8 are cross-sectional views illustrating a method of fabricating a MOSFET having a recessed channel according to an embodiment of the present invention.

As shown in FIG. 2, a field ion implantation region 111 is formed in a semiconductor substrate 100 such as a single crystalline silicon substrate. A device isolation layer 105 is formed to define an active region and an inactive region. The device isolation layer 105 may be formed by a known shallow trench isolation (STI) technique.

Next, a buffer oxide layer 110 is thinly deposited on the semiconductor substrate 100 where the field ion implantation region 111 and the device isolation layer 105 are formed. Afterwards, with regard to the depth of a recessed trench to be formed later, an ion implantation region 113, for adjusting a channel, and a surface source/drain region 115 are formed using ion implantation processes. The buffer oxide layer 110 may be formed of a silicon oxide layer using a conventional method such as chemical vapor deposition (CVD), sub-atmospheric CVD (SACVD), low pressure CVD (LPCVD), or plasma enhanced CVD (PECVD). Next, a photoresist layer 120 is formed and patterned to expose a portion of the underlying device where a recessed channel will later be formed. The critical dimension (CD) of the open portion may be about 90 nm.

Figure 3:
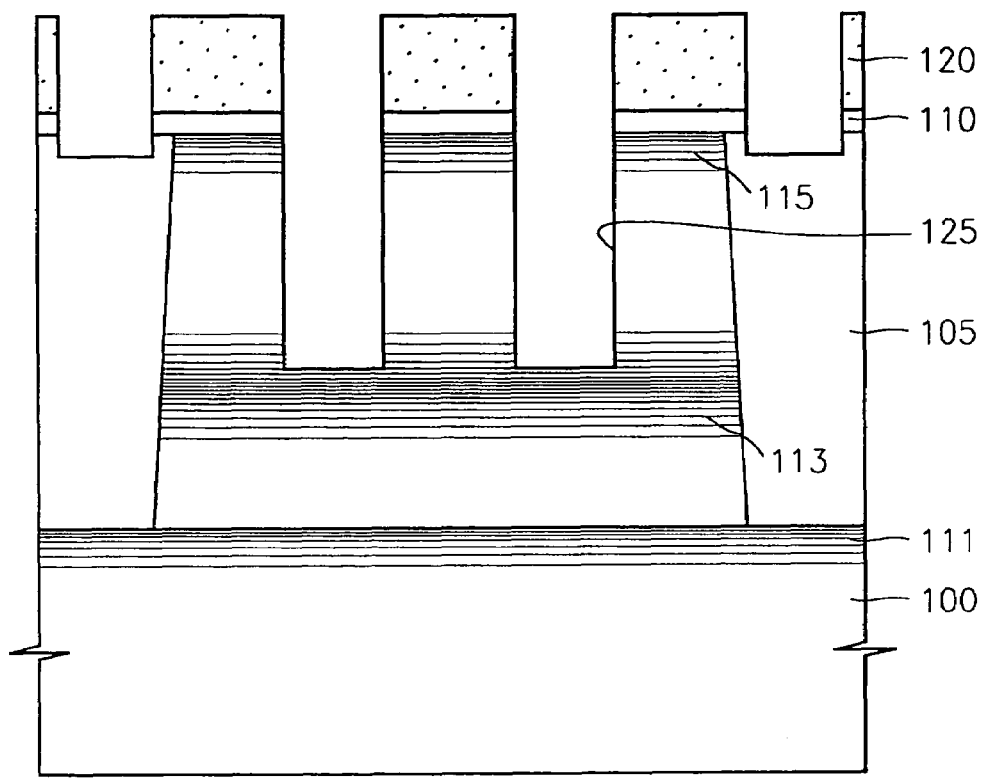

Referring to FIG. 3, the semiconductor substrate 100 is etched using the photoresist layer 120 as an etch mask, thereby forming a trench 125 having a depth of about 1000 Å to 1500 Å. Here, the semiconductor substrate 100 may be etched using a conventional RIE process. In prior art, a mask stack having a complicated structure is formed by further forming spacers on a silicon nitride mask and then forming a narrow recessed trench (30 of FIG. 1) using the mask stack. However, in the present invention, because the CD of the trench 125 is greater than that of the conventional structure, the trench 125 can be simply formed using only the photoresist layer 120 as an etch mask. This RIE process described above makes the trench 125 have a rectangular profile.

Figure 4:
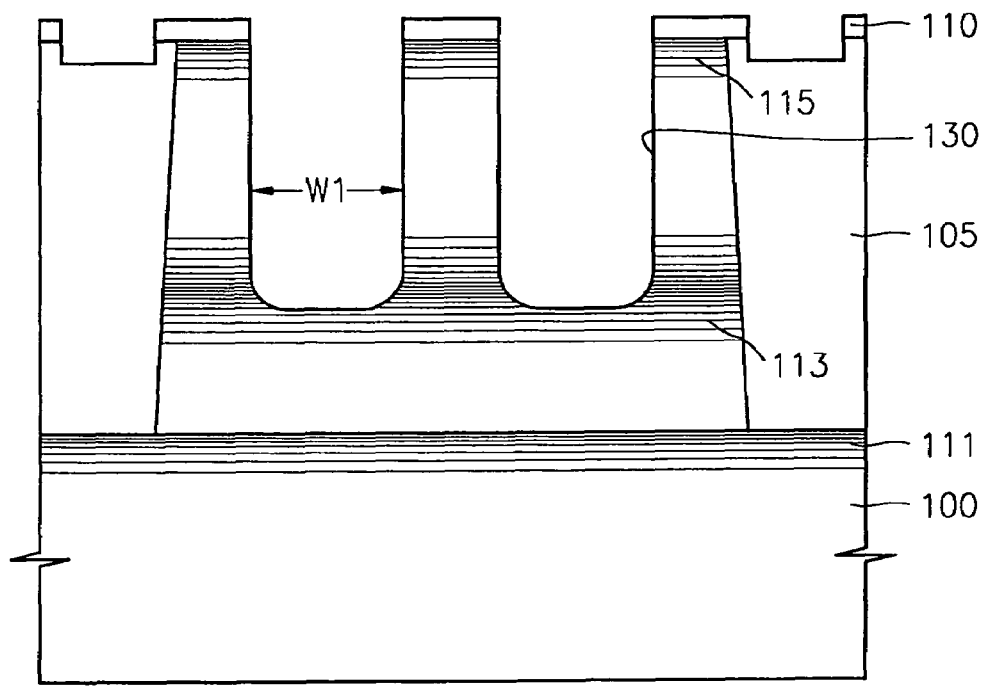

As shown in FIG. 4, the photoresist layer 120 is removed using ashing and stripping, and then the semiconductor substrate 100 is further selectively etched by about 100 Å to 200 Å by a CDE process using $O_2$ gas and $CF_4$ gas. The CDE process is performed in order to remove silicon, which is not etched from edges of the active region due to the inclination of the trench, and also to make the profile of the trench 125 round. As a result, a recessed trench 130 having a round profile and a CD of W1 is completed.

Figure 5:
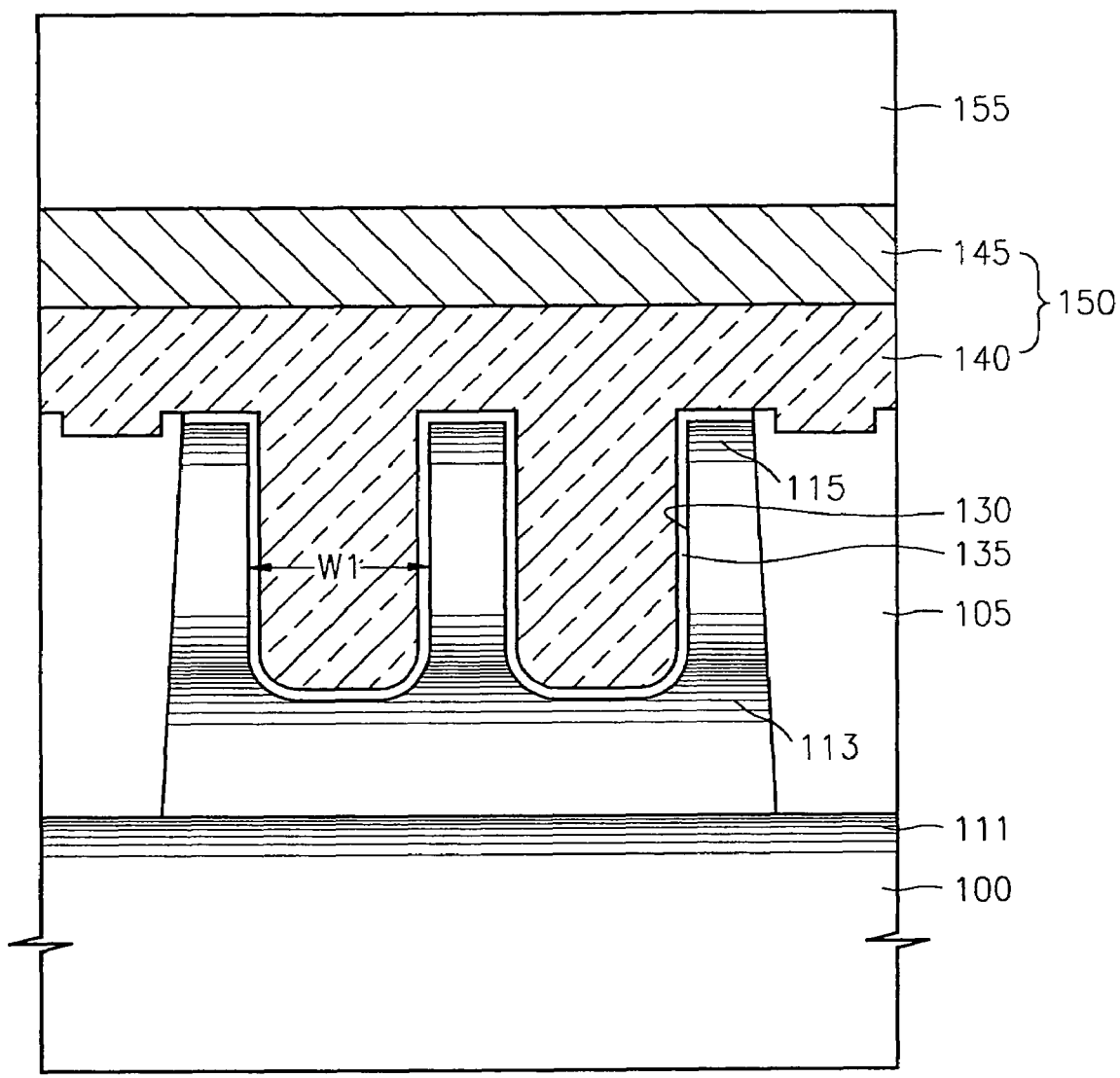

Referring to FIG. 5, a sacrificial oxide layer (not shown) is formed using thermal oxidation to remove etching damage caused by the formation of the trench. Then, the buffer oxide layer 110, which remains after performing the steps shown in FIG. 4, is removed using a wet etch process along with the sacrificial oxide layer. Here, the wet etch process may be performed using an HF diluted solution. For example, the mixture ratio of fluoric acid (HF) and deionized water ($H_2O$) may be 1:5-1000 and is maintained at a temperature of 25±3° C. The mixture ratio of the fluoric acid and the deionized water is preferably 1:100-200. The buffer oxide layer 110 and the sacrificial oxide layer may also be removed using a buffered oxide etchant (BOE) in place of the HF diluted solution. Afterwards, a gate oxide layer 135 is deposited using a silicon oxide layer, a titanium oxide layer, or a tantalum oxide layer. Next, a conductive polysilicon layer 140 is deposited on the gate oxide layer 135. The conductive polysilicon layer 140 may be deposited using LPCVD at a temperature of 500° C. to 700° C. Forming the conductive polysilicon layer 140 may comprise depositing an undoped polysilicon layer and then doping it with arsenic (As) or phosphorus (P) ions using an ion implantation process. Alternatively, the conductive polysilicon layer 140 may be formed by in-situ doping impurity ions. The conductive polysilicon layer 140 is planarized using an etchback process or a CMP process. Then a metal layer 145 is further formed on the conductive polysilicon layer 140. The metal layer 145 may be, for example, W, an alloy of Al and Cu, or Cu. The metal layer 145 may be deposited using inductively coupled plasma (ICP), ionized metal plasma (IMP), sputtering, or CVD. Here, the stack of the conductive polysilicon layer 140 and the metal layer 145 constitute a gate conductive layer 150. The metal layer 145 can be further formed since it has a lower resistance than that of the conductive polysilicon layer 140. However, in some cases, the gate conductive layer 150 may be formed of a conductive polysilicon layer and a silicide layer. Alternatively, the gate conductive layer 150 may be formed of only a conductive polysilicon layer. After that, a capping layer 155 is deposited to protect the gate conductive layer 150 using an insulating material, such as a silicon nitride. If a silicon nitride capping layer is used, it can be deposited using PECVD or LPCVD. The capping layer 155 is further formed using a reaction between $SiH_4$ and $NH_3$ at a temperature of about 500° C. to 850° C.

Figure 6:
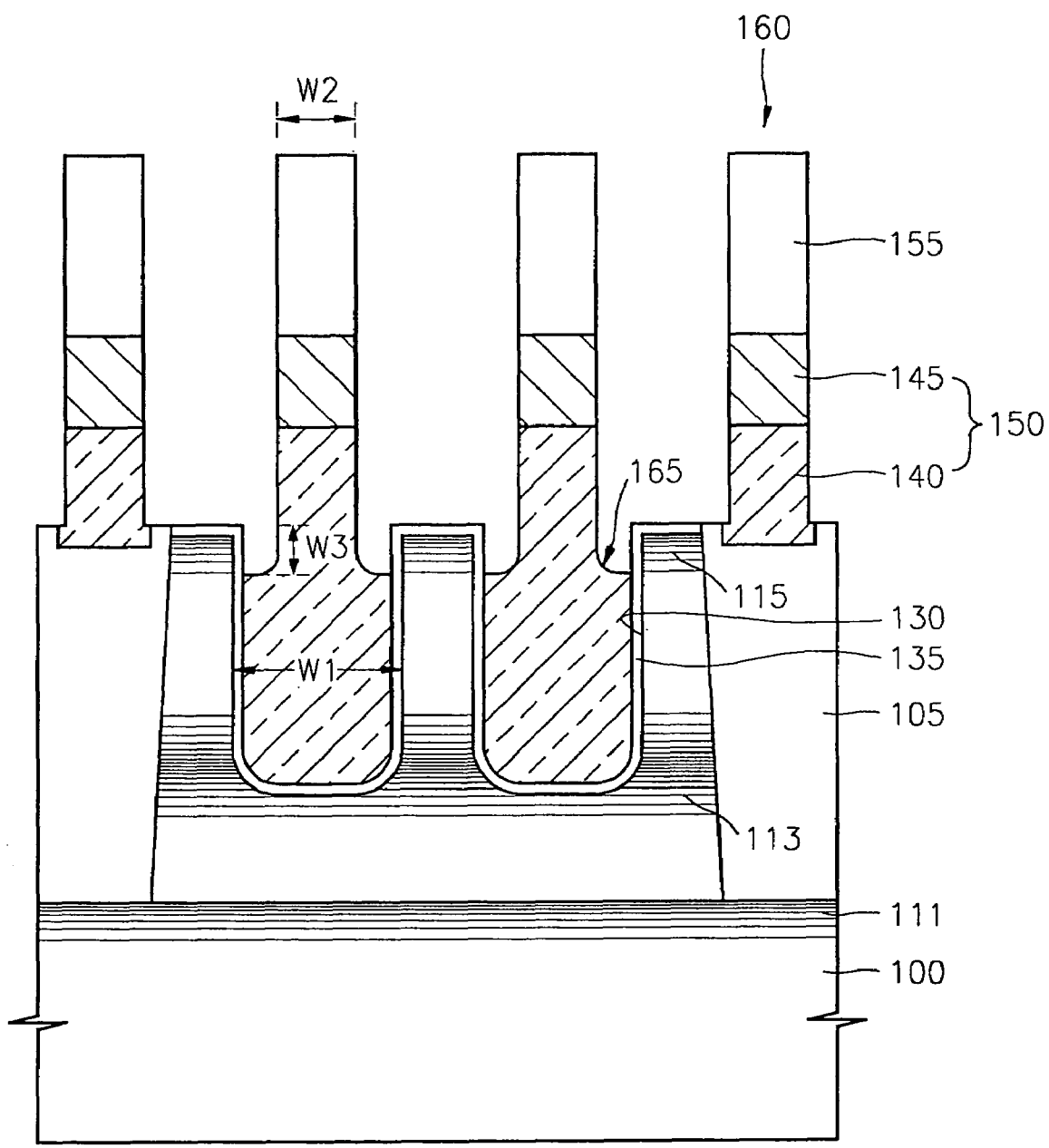

Referring to FIG. 6, the capping layer 155 and the gate conductive layer 150 are successively patterned using a gate mask. This results in a completed gate electrode 160, which has a smaller CD W2 than the CD W1 of the recessed trench 130. Since the gate electrode 160 is formed to be smaller than the recessed trench 130, the gate electrode 160 is overlapped by the recessed trench 130. Here, a groove 165 may be formed by recessing the gate conductive layer 150 from the surface of the semiconductor substrate 100. The depth W3 of the groove 165 can be adjusted to be 500 Å or less by controlling the etching time. The uniformity of the groove 165 does not affect characteristics of the MOSFET since a source/drain junction region will be formed in the semiconductor substrate 100 at a depth of about 1000 Å, while the groove depth W3 is only at about 500 Å.

Figure 7:
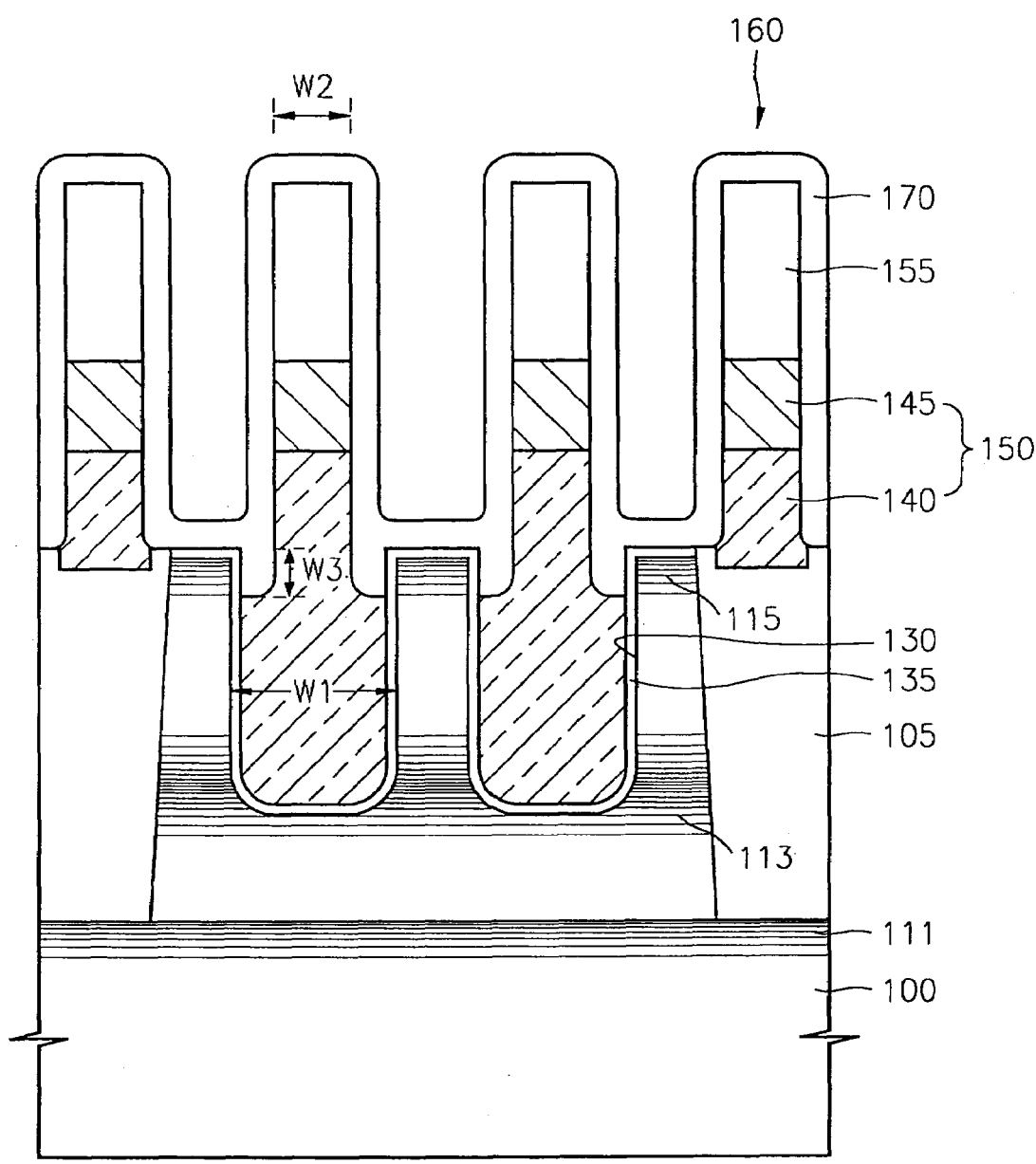

Referring to FIG. 7, a gate reoxidation process is performed by exposing the gate electrode 160 to heat and an oxygen atmosphere. Thus, a thermal oxide layer (not shown) is formed on the sidewalls of the gate conductive layer 150. The reoxidation process leads to removal of etching damage caused by patterning of the gate electrode 160, removal of residues of the gate conductive layer 150, and formation of a reliable gate oxide layer 135. Afterwards, a lightly doped drain (LDD) is formed using n-type impurity ions, which are implanted to form a source/drain region. However, this ion implantation process may be omitted. Next, gate spacers 170, which are made of an insulating material such as a silicon nitride, are formed using PECVD or LPCVD.

Figure 8:
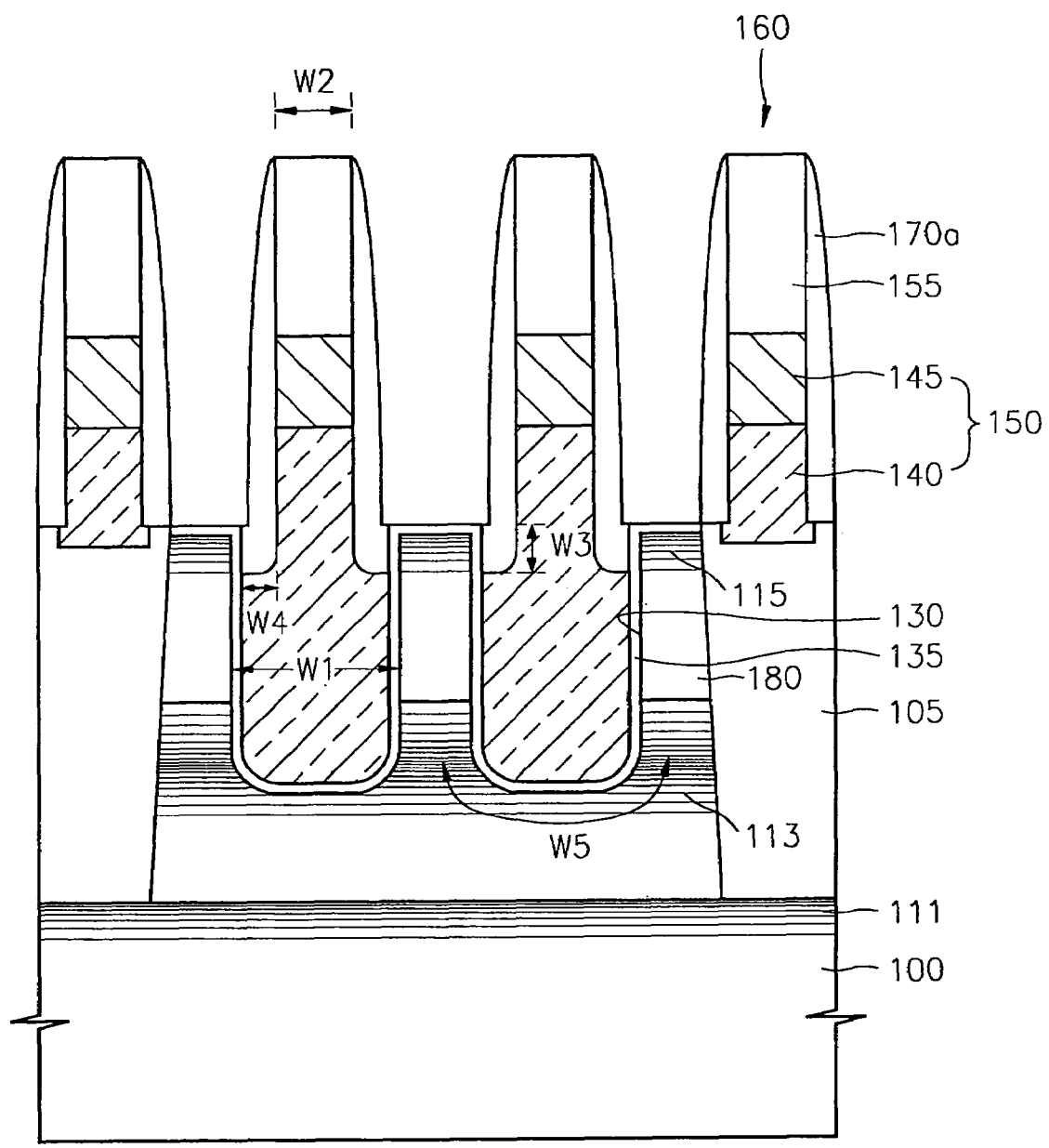

As shown in FIG. 8, the gate spacers 170 are etched using an anisotropic etch process so as to form spacers 170a on the sidewalls of the gate electrode 160. Impurity ions are implanted using the spacers 170a and the capping layer 155 as an ion implantation mask. This forms a source/drain region 180 in the semiconductor substrate 100. The source/drain region 180 is insulated from the gate conductive layer 150 by the gate oxide layer 135.

As described above, a MOSFET having a recessed channel according to the present invention will have gate electrode 160 overlapped by the recessed trench 130, since the CD W1 of the recessed trench 130 is greater than the CD W2 of the gate electrode 160. Hereinafter, the MOSFET according to the present invention as shown in FIG. 8 will be compared with the conventional structure of FIG. 1. First, in the present invention, the CD W2 of the gate electrode 160 is smaller than the CD W1 of the recessed trench 130. Thus, the gate electrode is overlapped by the recessed trench 130.

In a case where the overlap CD W4 is the same and the CD of the gate electrode is the same (L2=W2), the CD W1 of the recessed trench 130 according to the present invention is 4 times the overlap CD W4 as large as the CD L1 of the conventional recessed trench 30.

Also, as shown in FIG. 8, in the present invention, the effective channel length W5 is longer compared to that of the conventional structure. This is because the size of the recessed trench 130 becomes larger than the conventional structure. As a result, a reduction in a channel region, caused by high integration, can be effectively compensated for. Thus, a short channel effect and a punch-through phenomenon can be prevented, which leads to improved characteristics of a device.

In an upper edge of the recessed trench 130, which corresponds to a portion denoted by reference numeral 70 in FIG. 1, the crowding of an electric field can be alleviated, thus reducing leakage current and also maintaining the breakdown voltage at a constant level. Also, in FIG. 8, as the groove 165 is formed, an overlap region of the source/drain junction and the gate electrode is reduced as much as the depth W3 of the groove 165. Thus, overlap capacitance and gate induced drain leakage (GIDL) can be reduced as compared to the conventional structure.

Further, the conventional structure requires an additional mask, i.e., a silicon nitride mask where spacers are further formed, unlike embodiments of the present invention, in which the trench can be etched using only a photoresist layer. As a result, electric properties of the MOSFET can be improved and the MOSFET can be highly integrated. While the present invention has been particularly shown and described with reference to an embodiment thereof, it will be understood by those of ordinary skill in the art that various changes in form and details may be made therein without departing from the spirit and scope of the present invention as defined by the following claims.

What is claimed is:

1. A method of forming a MOSFET having a recessed channel, comprising:
    forming a trench in a semiconductor substrate;
    forming a gate dielectric layer on an inner wall and a bottom of said trench;
    sequentially forming a gate conductive layer and a capping layer on the gate dielectric layer so as to fill the trench;
    forming a gate electrode having a first portion which rises over the semiconductor substrate and a second portion filling the trench by successively patterning the capping layer and the gate conductive layer, wherein the first portion has a smaller width than that of the second portion; and
    forming a source/drain region by implanting impurity ions into the semiconductor substrate on both sides of the gate electrode.

2. The method of claim 1, wherein forming the trench comprises:
    forming a rectangular trench in the semiconductor substrate using an etch process; and
    making the trench have a round profile by further etching the trench using a chemical dry etch process.

3. The method of claim 2, wherein the rectangular trench is formed to a depth of about 1000 Å to 1500 Å and is further etched by about 100 Å to about 200 Å using a chemical dry etch process.

4. The method of claim 2, wherein the etch process is a reactive ion beam etch process.

5. The method of claim 1, wherein the gate dielectric layer is formed of one selected from the group consisting of a silicon oxide layer, a titanium oxide layer, and a tantalum oxide layer.

6. The method of claim 1, wherein the gate conductive layer comprises a conductive polysilicon layer that fills the trench and a metal layer formed on the conductive polysilicon layer.

7. The method of claim 1, wherein forming the trench further compromises:
    forming a sacrificial oxide layer by thermally oxidizing the semiconductor substrate; and
    removing the sacrificial oxide layer using a wet etch process.

8. The method of claim 1, wherein forming the gate electrode comprises recessing the gate conductive layer that fills the trench to a depth of 500 Å or less from the surface of the semiconductor substrate.

9. The method of claim 8, further comprising forming spacers on the sidewalls of the gale electrode, wherein a portion of the spacers are extended into the semiconductor substrate.

10. The method of claim 1, further comprising forming spacers on sidewalls of the gate electrode.

11. The method of claim 10, wherein the width of the first portion of the gate electrode plus the spacers is less than that of the second portion of the gate electrode.

12. The method of claim 11, wherein the spacers extend the entire height of the first portion of the gate electrode.

13. The method of claim 1, wherein the source/drain region is shallower than the bottom of the trench.

14. A method of forming a MOSFET having a recessed channel, comprising:
    forming a trench in a semiconductor substrate using a etch process;
    forming a gate dielectric layer on an inner wall and a bottom of said trench;
    sequentially forming a gate conductive layer and a capping layer on the gate dielectric layer so as to fill the trench;
    forming a gate electrode having a first portion which rises over the semiconductor substrate and a second portion filling the trench by successively patterning the capping layer and the gate conductive layer, wherein the first portion has a smaller width than that of the second portion;
    forming spacers on the sidewalls of the gate electrode, wherein a portion of the spacers are extended into the semiconductor substrate; and forming a source/drain region by implanting impurity ions into the semiconductor substrate on both sides of the gate electrode, wherein forming the gate electrode comprises recessing the gate conductive layer that fills the trench to a depth of 500 Å or less from a top surface of the semiconductor substrate by adjusting etching time.

15. The method of claim 14, wherein the trench is formed to a depth of about 1000 Å to about 1500 Å and is further etched by about 100 Å to about 200 Å using a chemical dry etch process.

16. The method of claim 14, wherein the source/drain region is shallower than the bottom of the trench.

17. A method of forming a semiconductor device having a recessed channel, comprising:

forming a rectangular trench in a semiconductor substrate using an etch process;

forming a gate dielectric layer on an inner wall and a bottom of said trench;

forming a gate conductive layer and a capping layer on the gate dielectric layer to fill the trench;

forming a gate electrode having a first portion which rises over the semiconductor substrate and a second portion filling the trench by successively patterning the capping layer and the gate conductive layer, wherein the first portion has a smaller width than that of the second portion, and wherein forming the gate electrode comprises recessing the gate conductive layer that fills the trench to a depth of 500 Å or less from the surface of the semiconductor substrate; and forming a source/drain region by implanting impurity ions into the semiconductor substrate on both sides of the gate electrode.

18. The method of claim 17, wherein forming the capping layer is performed immediately after forming the gate conductive layer.

* * * * *

UNITED STATES PATENT AND TRADEMARK OFFICE
CERTIFICATE OF CORRECTION

PATENT NO. : 7,250,342 B2 Page 1 of 1
APPLICATION NO. : 10/699047
DATED : July 31, 2007
INVENTOR(S) : Ji-young Kim It is certified that error appears in the above-identified patent and that said Letters Patent is hereby corrected as shown below:

Column 6, line 38, the word "gale" should read -- gate --.

Signed and Sealed this

Second Day of September, 2008

JON W. DUDAS
*Director of the United States Patent and Trademark Office*